(12) United States Patent
Needham

(10) Patent No.: US 6,408,410 B1
(45) Date of Patent: *Jun. 18, 2002

(54) METHOD AND APPARATUS FOR BUILT IN SELF-TEST OF BUFFER CIRCUITS FOR SPEED RELATED DEFECTS

(75) Inventor: Wayne M. Needham, Gilbert, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/874,823

(22) Filed: Jun. 13, 1997

(51) Int. Cl.[7] ................................................ H02H 3/05
(52) U.S. Cl. ........................................ 714/724; 714/733
(58) Field of Search ................................. 714/724, 727, 714/733, 735

(56) References Cited

U.S. PATENT DOCUMENTS

| | | | | |
|---|---|---|---|---|
| 3,569,866 A | * | 3/1971 | Hearn | 331/117 |
| 3,585,285 A | * | 6/1971 | Rennick | 348/506 |
| 3,780,219 A | * | 12/1973 | O'Toole | 348/654 |
| 3,927,371 A | | 12/1975 | Pomeranz et al. | 714/740 |
| 4,055,733 A | * | 10/1977 | Holsinger et al. | 375/228 |
| 4,801,870 A | | 1/1989 | Eichelberger et al. | 714/736 |
| 5,016,469 A | * | 5/1991 | Henderson | 73/64.42 |
| 5,329,533 A | | 7/1994 | Lin | 371/22.3 |
| 5,583,786 A | | 12/1996 | Needham | 364/488 |
| 5,588,006 A | * | 12/1996 | Nozuyama | 371/22.3 |
| 5,615,390 A | * | 3/1997 | Kurahara | 395/834 |
| 5,621,739 A | | 4/1997 | Sine et al. | 371/22.1 |
| 5,633,599 A | * | 5/1997 | Kubota | 371/22.6 |
| 5,640,509 A | * | 6/1997 | Balmer et al. | 395/183.06 |
| 5,790,560 A | * | 8/1998 | Durham et al. | 371/22.1 |

* cited by examiner

*Primary Examiner*—Dieu-Minh Le
(74) *Attorney, Agent, or Firm*—Blakely, Sokoloff, Taylor & Zafman LLP

(57) ABSTRACT

A self-testing buffer circuit. In one embodiment, the buffer circuit of the present invention provides built in self-testing of input/output circuits on high speed devices without the need for expensive high end testers by switchably coupling the early input stage of a buffer circuit to the late output stage of the buffer circuit to create an oscillating feedback loop during self-test. A counter is used to count the total number of oscillations for a period of time to determine the oscillation rate of the input/output buffer circuit during the self-test. At the end of the count sequence, the count value is scanned out of the counter and it is determined whether the count value is within an expected range. If the count value is not within an expected range, then there is an increased probability of a speed related defect in the buffer circuit.

16 Claims, 3 Drawing Sheets

METHOD AND APPARATUS FOR BUILT IN SELF-TEST OF BUFFER CIRCUITS FOR SPEED RELATED DEFECTS

BACKGROUND OF THE INVENTION

1. Field of the Invention

The present invention relates generally to the field of integrated circuits and, more specifically, the present invention relates to testing of buffer circuits in integrated circuits.

2. Background Information

Within the integrated circuit industry there is a continuing effort to increase integrated circuit speed as well as device density. As integrated circuit features continue to shrink, test costs relentlessly rocket skyward. Greater numbers of interface nodes, higher operating frequencies and specialized packaging arrangements such as multi-chip modules all contribute to soaring test costs.

To reduce the possibility of delivering defective chips to customers, testing is performed on integrated circuit dies prior to shipping. Equipment for testing integrated circuits increases in cost and complexity as die contacts decrease in size and increase in number. Indeed, the cost of exhaustive testing of every interface node of an integrated circuit is prohibitive. Unfortunately, saving costs by reducing testing may result in an increased probability of defective chips being sold to customers.

Output buffers and input/output buffers are features of an integrated circuit that typically must be thoroughly tested prior to sale. In order to identify speed related defects, these buffers are generally verified with test equipment that skews the relative relation between data signals and a clock or strobe signal until a failure is detected. Use of test equipment of this nature is generally very expensive, difficult to maintain and hard to use. With the continuing effort to increase integrated circuit speeds, the identification of speed related defects in integrated circuit input and output buffers with prior art test equipment may become a prohibitively challenging task because of the speed limitations associated with present day tester technology.

As will be seen, one embodiment of the present invention provides a built in self-test of integrated circuit input and output buffers for speed related defects without the use of expensive test equipment.

SUMMARY OF THE INVENTION

A method and an apparatus for self-testing a buffer circuit is disclosed. In one embodiment, an oscillating feedback loop is created between an output of a buffer circuit and an input of the buffer circuit. A rate of oscillation is then measured in the feedback loop to identify a speed related defect in the buffer circuit. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for self-testing a buffer circuit for speed related defects is disclosed. In the following detailed description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

In one embodiment of the present invention, a built in self-test method and apparatus is provided for the testing of input/output buffer circuits on high speed devices to identify speed related defects without the need for expensive high end test equipment. In one embodiment, the early input stages of a buffer circuit are switchably coupled to the late output stages of the buffer circuit to create a feedback loop. An odd number of total inversions are included in the signal path of the buffer circuit to cause the buffer circuit to oscillate. In one embodiment, a counter and corresponding test and control logic are coupled to a sample point along the signal path of the buffer circuit. The frequency or rate of oscillation of a signal oscillating in the buffer circuit is measured. In one embodiment, if the rate of oscillation of the buffer circuit during self-test is inconsistent with an expected rate of oscillation of a normally functioning buffer circuit, then the buffer circuit is more likely to have a speed related defect. If the rate of oscillation is consistent with the expected rate of oscillation of a properly functioning circuit, then the buffer circuit is less likely to have a speed related defect.

Figure 1:
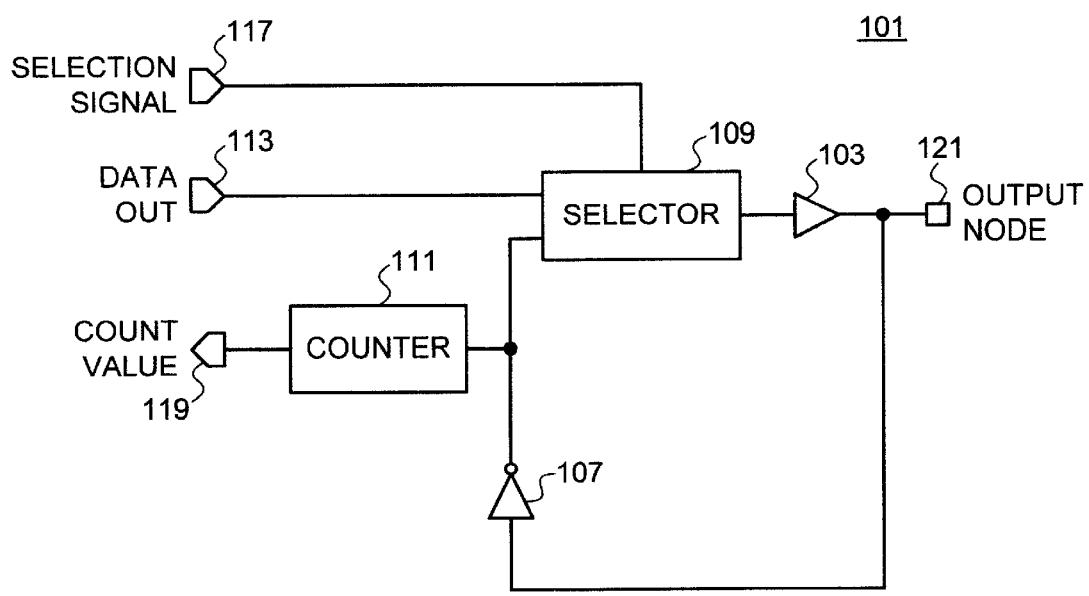
FIG. 1 is a block diagram of one embodiment of a built in self-testing buffer circuit according to the teachings of the present invention.

FIG. 1 shows one embodiment of a buffer circuit 101 in accordance with the teachings of the present invention. Buffer circuit 101 includes an output driver circuit 103 having an output coupled to an output node 121 as shown. Selector circuit 109 is coupled to an input of output driver circuit 103. Selector circuit 109 is coupled to receive data out 113 and an output of a feedback circuit 107. In one embodiment, the input to output driver circuit 103 as shown in FIG. 1 is an early input stage of buffer circuit 101 and the output of output driver circuit 103 is a late output stage of buffer circuit 101. In another embodiment, feedback circuit 107 is an inverter coupled between selector circuit 109 and output node 121. In yet another embodiment, selector circuit 109 is a multiplexor which selects between data out 113 and the output of feedback circuit 107 in response to a selection signal 117.

In one embodiment, selection signal 117 is used to switch buffer circuit 101 between normal mode and self-test mode. When in normal mode, selector circuit 109 chooses data out 113 to be passed to output driver circuit 103, which is then output to output node 121. When in built in self-test mode, selector circuit 109 chooses the output of feedback circuit 107 to be passed to the input of output driver circuit 103. Data out 113 is decoupled from the input of output driver circuit 103 during self-test mode.

In the embodiment shown in FIG. 1, feedback circuit 107 is an inverter, which results in an odd number of total inversions in the signal path of buffer circuit 101. With the feedback loop created by feedback circuit 107, an oscillating signal is propagated through output driver circuit 103 and feedback circuit 107. In one embodiment, a counter 111 is coupled to the signal path of the oscillating signal to measure the frequency of the oscillating signal. In the embodiment shown, counter 111 is coupled to the output of feedback circuit 107 and generates count value 119. It is noted that counter 111 may be coupled to other locations in the signal path of the oscillating signal, such as for example the output of output driver circuit 103 or the output of selector circuit 109. In one embodiment, counter 111 is configured to count the number of oscillations that occur within a particular amount of time to determine the frequency of the oscillating signal during self-test.

To illustrate, counter 111 is configured to count the number of oscillations generated at the output of feedback circuit 107 within a particular window of time while buffer circuit 101 is in self-test mode. If the number of oscillations that are counted by counter 111 is consistent with the number of oscillations that are expected to occur in a properly functioning buffer circuit 101, then it is less likely that there is a speed related defect in the signal path of buffer circuit 101. If, however, the number of oscillations counted by counter 111 within the time window is inconsistent with the expected number of oscillations for a properly functioning circuit, then there is an increased likelihood that a speed related defect exists in the signal path of buffer circuit 101.

Assume for example that buffer circuit 101 oscillates a frequency of approximately 1 GHz in the absence of a speed related defect. In this example, each oscillation would thus have period of 1 ns. If counter 111 is configured to count the number of oscillations over a 10 ns period of time, then counter 111 should count approximately 10 cycles if there are no speed related defects in buffer circuit 101. If, for example, counter 111 counts only 5 cycles over the period of 10 ns, then the signal oscillating through buffer circuit is oscillating at a frequency of only approximately 500 MHz instead of 1 GHz. In this case, assuming that 5 cycles is outside an acceptable tolerance from the expected 10 cycles, there is an increased likelihood of a speed related defect in buffer circuit 101.

Figure 2:
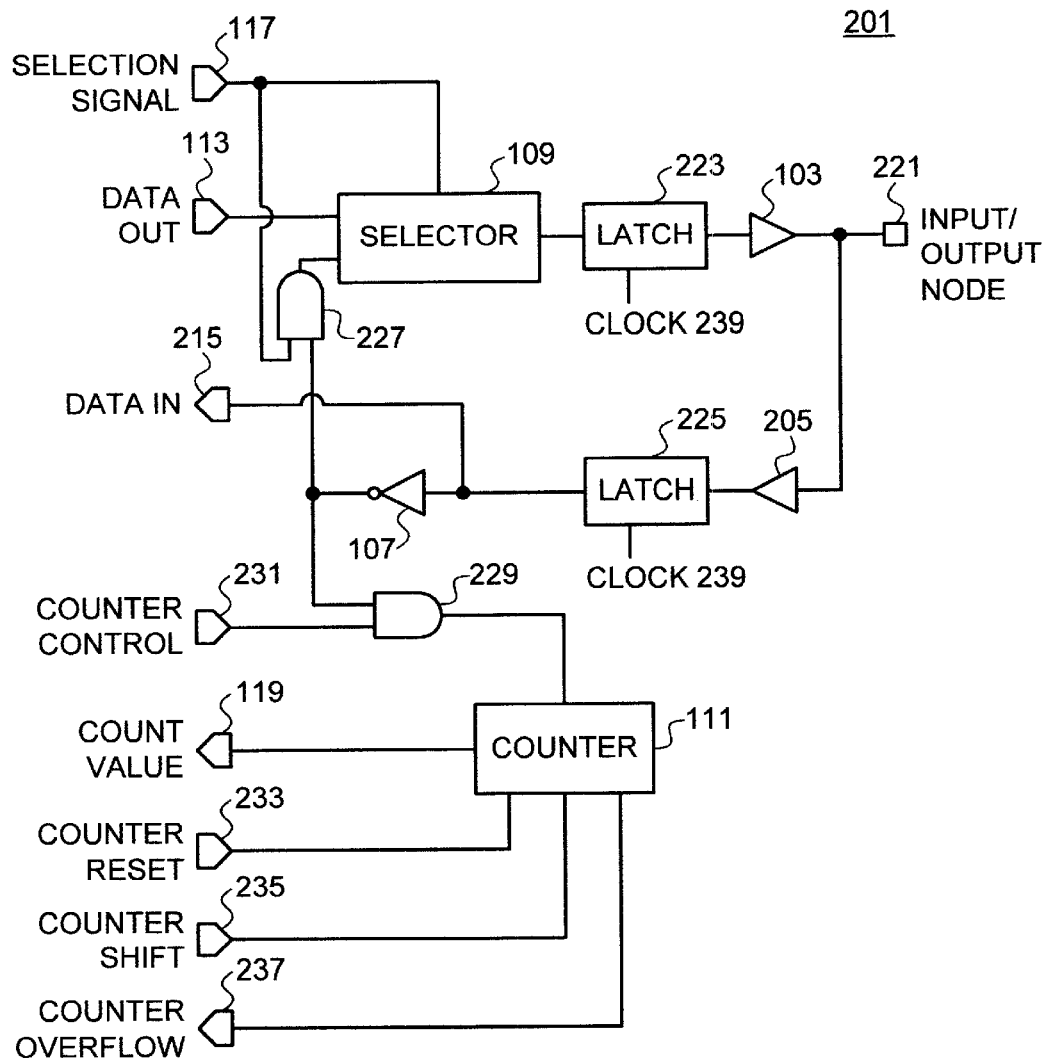
FIG. 2 is a block diagram of a built in self-testing buffer circuit in accordance with the teachings of the present invention.

FIG. 2 shows a diagram of another embodiment of a buffer circuit 201 in accordance with the teachings of the present invention. In one embodiment, buffer circuit 201 is an input/output buffer. Data out 113 is received by buffer circuit 201 through a selector circuit 109 to an output latch 223. An output of output latch 223 is coupled to an input of output driver circuit 103, which generates an output coupled to an input/output node 221. An input of an input buffer circuit 205 is coupled to input/output node 221. Data in 215 may be read through an input latch 225, which is coupled to an output of input buffer circuit 205. Feedback circuit 107 is also coupled to an output of input latch 225 and is coupled to an input of an AND gate 227. In one embodiment, latch 223 and latch 225 are clocked with clock 239. In one embodiment, feedback circuit 107 is an inverter. An output of AND gate 227 is coupled to an input of selector circuit 109. Selection signal 117 is coupled to be received by AND gate 227 and another input of selector circuit 109.

In one embodiment, selection signal 117 is used to switch buffer circuit 201 between normal mode and self-test mode. When in normal mode, selector circuit 109 passes data out 113 to output latch 223 and the output of feedback circuit 107 is decoupled from selector circuit 109 through AND gate 227. Data in 215 receives data through input latch 225 and input buffer circuit 205 from input/output node 221. When in self-test mode, selector circuit 109 passes the output of feedback circuit 107 through AND gate 227 in response to selection signal 117. In one embodiment, feedback circuit 107 is an inverter, which results in an odd number of total inversions in the signal path of buffer circuit 201. Since there are an odd number of total inversions in the signal path through output driver circuit 103, input buffer circuit 205 and feedback circuit 107, an oscillating feedback loop is created in buffer circuit 201. In one embodiment, clock 239 is configured to allow output latch 223 and input latch 225 using well-known techniques to freely pass oscillating signals during self-test mode.

Counter 111 is coupled to the output of feedback circuit 107 through an AND gate 229 to measure the rate of oscillation of the oscillating signal at the output of feedback circuit 107. In one embodiment, counter control 231 is used to enable AND gate 229 to pass the oscillating signal from feedback circuit 107 to counter 111 while buffer circuit 201 is in self-test mode. In one embodiment, counter 111 is reset in response to counter reset 233 prior to self-test mode being enabled with selection signal 117 in buffer circuit 201. At the end of a count sequence of self-test mode, the contents of counter 111 may be scanned out at count value 119 using counter shift 235 using well known techniques, such as for example, a Joint Test Action Group (JTAG) boundary/scan approach, which is governed by the IEEE 1149.1 testability bus standard. It is noted that other well known techniques may also be used to access the contents of counter 111 at the end of a count sequence in accordance with the teachings of the present invention.

In one embodiment, counter 111 is configured to be mostly filled at the end of a count sequence. In another embodiment, a window pulse that determines the duration of the self-test period is applied through test pins of the chip of buffer circuit 201. The exact value of the pulse is determined by the number of stages in counter 111, the process speed, the number of inversions in the feedback loop of buffer circuit 201 and the desired accuracy of the self-test measurement. To illustrate, one embodiment of the present invention may include a counter 111 with 10 bits, or a 1024 count capacity. In this embodiment, counter 111 may be switched on for a period of time during self-test to count, for example, approximately 900 oscillations for a defect-free buffer circuit 201. That is, counter 111 should count approximately 900 oscillations, or a nearby value within an acceptable tolerance, during a self-test of buffer circuit 201 if no speed related defects are present. If, however, counter 111 counts only 500 oscillations within the self-test period, which in one embodiment is outside an acceptable tolerance, then there is an increased likelihood that a speed related defect exists in buffer circuit 201.

In one embodiment, the process used for determination of defective and defect free buffer circuits relies upon characterization of the buffer circuit material with bench measurements. Typical material that is defect free varies over a certain range based on the design, distribution and input/output sensitivity, among other parameters. Thus, for example, an expected value of 900 might have an acceptable range of 875 to 955 counts in one embodiment, while in another embodiment, an acceptable range for a target of 900 could be as low as 600 and as high as 1200.

In another embodiment, it is appreciated that counter 111 is designed to have an adequate number of bits to reduce the probability of aliasing problems from occurring during self-test of buffer circuit 201. For example, if a speed related defect in buffer circuit 201 results in the oscillating frequency of buffer circuit 201 being increased, there is a possibility that counter 111 may roll over and result in an erroneous final count value nearly equal to an expected value of a properly functioning buffer circuit. Accordingly, in one embodiment, counter 111 is designed to have an adequately large capacity to reduce the probability of aliasing problems of this type from occurring during self-test. In another embodiment, counter 111 is designed not to roll over when a maximum value of counter 111 is reached during self-test. In this embodiment, a return of a counter value equal to the maximum value of counter 111 indicates an increased likelihood of a speed related defect in buffer circuit 201. In yet another embodiment, counter 111 generates counter overflow 237, which is activated when counter 111 overflows during a self-test operation. In this embodiment, when counter overflow 237 is active at the end of a count sequence of self-test mode, there is an increased likelihood of a speed related defect in buffer circuit 201.

Figure 3:
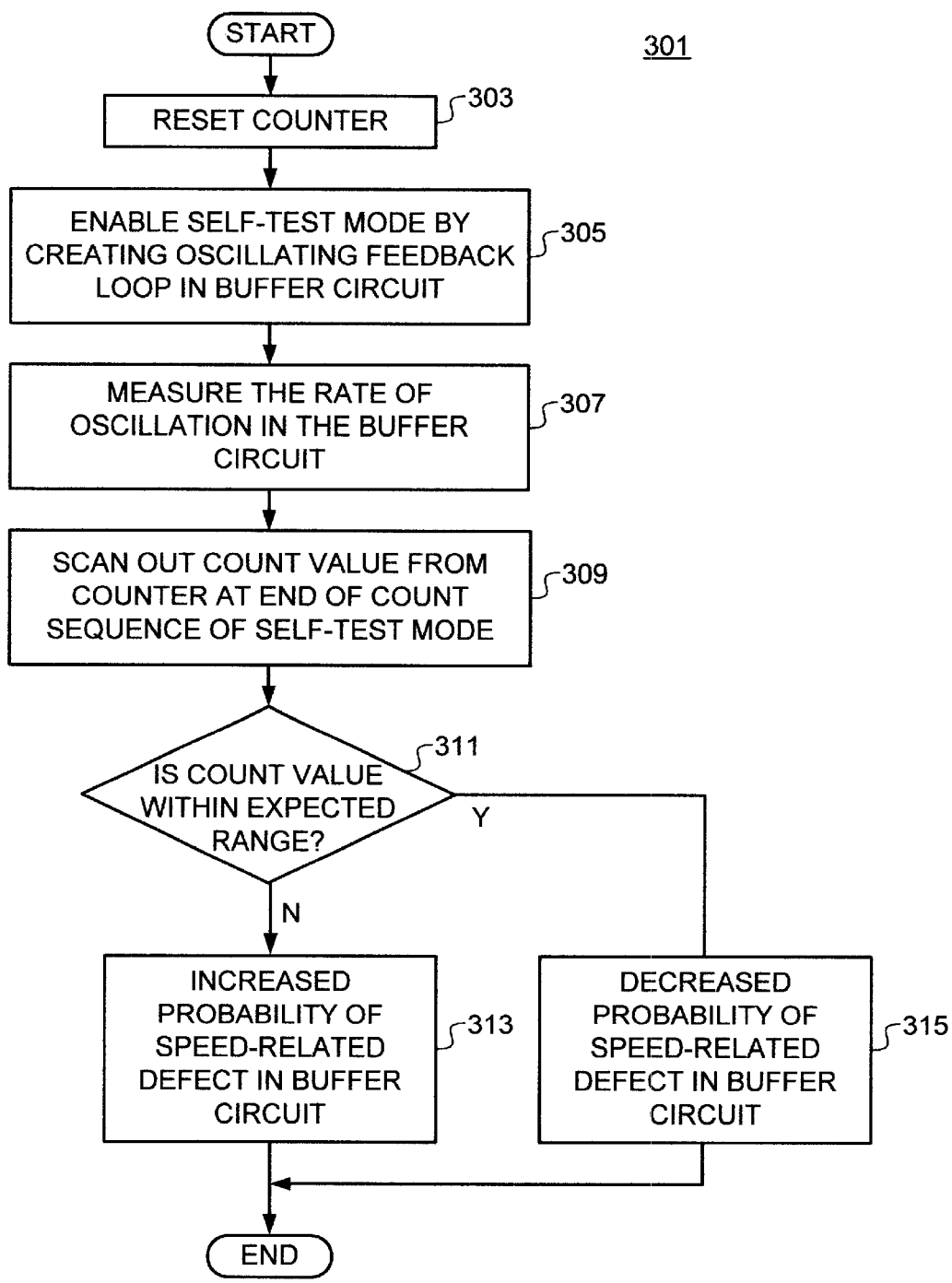
FIG. 3 is a flow diagram of processing steps performed to identify speed related defects in a buffer circuit in accordance with the teachings of the present invention.

FIG. 3 is a flow diagram 301 illustrating the processing steps performed in accordance with one embodiment of the present invention. As shown in processing step 303, the counter of the present invention is initially reset before test mode is enabled. Afterwards, self-test mode is enabled in processing step 305, which creates a switchable oscillating feedback loop in the buffer circuit. Next, the rate of oscillation in the buffer circuit is measured in processing step 307 by counting the total number of oscillations within a period of time. At the end of the count sequence of self-test mode, the contents of the counter are scanned out to determine the oscillating frequency of the buffer circuit as shown in processing step 309. In processing step 311, it is determined whether the count is within an expected range. If the count is outside an expected range, then there is an increased probability of a speed related defect in the buffer circuit as shown in step 313. If the count is within an expected range, then there is a decreased probability of a speed related defect in the buffer circuit, as shown in step 315.

Thus, the present invention provides a self-testing of buffer circuit to detect speed related defects without the need for expensive high end test equipment. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:
   characterizing a buffer circuit on an integrated circuit using a built-in test circuit by:
   switching the buffer circuit to self-test mode;
   switchably coupling a feedback circuit to an input of an output buffer in the buffer circuit and propagating an oscillating signal through the output buffer;
   switchably coupling a counter to a sample point along a signal path of the buffer circuit and counting a number of oscillations in the output buffer circuit during a predetermined time period; and
   determining that the buffer circuit is defective if the number of oscillations is outside a predetermined tolerance.

2. The method of claim 1, further comprising resetting the counter prior to switchably coupling a counter to a sample point along a signal path of the buffer circuit.

3. The method of claim 2, further comprising switchably decoupling a data out signal from the input of the output buffer.

4. The method of claim 1 wherein counting the number of oscillations in the output buffer for a predetermined time period includes indicating if a maximum count of the counter is reached within the predetermined time period.

5. The method of claim 4, further comprising scanning out the number of oscillations.

6. An apparatus, comprising:
   a self-testing circuit on an integrated circuit, the self testing circuit having:
   a selection signal to switch the self-testing circuit to self-test mode;
   a selector coupled to receive the selection signal to switchably couple a feedback circuit to an input of an output buffer in the self-testing circuit and to couple an oscillating signal through the output buffer; and
   a counter coupled to count a number of oscillations in the output buffer circuit during a predetermined time period.

7. The apparatus of claim 6 wherein the feedback circuit comprises an inverter switchably coupled between the output buffer and the selector.

8. The apparatus of claim 6 wherein the selector includes a first input coupled to a data out signal and a second input coupled to the feedback circuit.

9. apparatus of claim 8 wherein the second input is switchably coupled to the feedback circuit in response to the selector.

10. The apparatus of claim 6 wherein the counter circuit is switchably coupled to the feedback circuit in response to a counter control signal.

11. The apparatus of claim 6 wherein the counter includes a scan data output configured to scan out a count value in response to a counter shift signal.

12. The apparatus of claim 11 wherein the count value is reset in response to a counter reset signal.

13. The apparatus of claim 6, further comprising:
   an input latch coupled between the feedback circuit and an output of the output buffer; and
   an output latch coupled between the selector and the input of the output buffer.

14. A self-testing input/output buffer circuit, comprising:
   an input circuit having an input circuit output and an input circuit input coupled to an input/output node of the self-testing buffer circuit;
   an output circuit having an output circuit input and an output circuit output coupled to the input/output node;
   a selector circuit having an output coupled to the output latch, the selector having a first input coupled to a data out signal and a second input, the selector circuit selecting between the first and second inputs in response to a selection signal;
   a feedback circuit coupled between an output of the input latch and the second input of the selector circuit, the feedback circuit configured to cause an oscillating signal through the input circuit, the output circuit and the feedback circuit; and
   a counter circuit coupled to the feedback circuit.

15. The self-testing input/output buffer circuit of claim 14 wherein the feedback circuit is selectively decoupled from the second input of the selector circuit in response to the selection signal.

16. The self-testing input/output buffer circuit of claim 14 wherein the counter circuit is selectively decoupled from the feedback circuit in response to a counter control signal.

* * * * *